United States Patent
Hamada et al.

(10) Patent No.: US 8,446,213 B2
(45) Date of Patent: May 21, 2013

(54) CHARGE PUMP CIRCUIT, CONTROL METHOD THEREOF, AND SEMICONDUCTOR INTEGRATED CIRCUIT

(75) Inventors: Takeshi Hamada, Tokyo (JP); Yoshihiko Koizumi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/522,114

(22) PCT Filed: Nov. 10, 2011

(86) PCT No.: PCT/JP2011/006300
§ 371 (c)(1),
(2), (4) Date: Jul. 13, 2012

(87) PCT Pub. No.: WO2012/063494
PCT Pub. Date: May 18, 2012

(65) Prior Publication Data
US 2012/0299642 A1   Nov. 29, 2012

(30) Foreign Application Priority Data
Nov. 12, 2010   (JP) ................................. 2010-253750

(51) Int. Cl.
*G05F 1/10*   (2006.01)
(52) U.S. Cl.
USPC ............................ 327/536; 327/534; 327/540
(58) Field of Classification Search
USPC ................. 327/536, 534, 535, 537, 538, 540, 327/541, 543, 589, 390
See application file for complete search history.

(56) References Cited

U.S. PATENT DOCUMENTS

| 4,812,961 | A | 3/1989 | Essaff et al. |
| 5,262,934 | A | 11/1993 | Price |
| 6,538,930 | B2 * | 3/2003 | Ishii et al. ................ 365/189.09 |
| 6,922,097 | B2 * | 7/2005 | Chan et al. ..................... 327/536 |
| 7,239,194 | B2 * | 7/2007 | Azrai et al. .................... 327/536 |
| 7,554,408 | B2 | 6/2009 | Chen et al. |
| 7,622,984 | B2 | 11/2009 | Lesso et al. |
| 7,626,445 | B2 | 12/2009 | Lesso et al. |
| 7,990,742 | B2 | 8/2011 | Lesso |

(Continued)

FOREIGN PATENT DOCUMENTS

| JP | 64-77465 | 3/1989 |
| JP | 02-261048 | 10/1990 |

(Continued)

*Primary Examiner* — Lincoln Donovan
*Assistant Examiner* — Jung H Kim
(74) *Attorney, Agent, or Firm* — Morgan, Lewis & Bockius LLP

(57) ABSTRACT

There is provided a charge pump circuit suited for reducing the power consumption. A capacitor 201*a*, a capacitor 201*b*, a capacitor 201*c*, and switching elements 202*a* to 202*k*, for electrically connecting or separating capacitors 201*a*, 201*b*, and 201*c*, repeats: a first state where charge supplied from an input power-supply voltage $V_{DD}$ is accumulated in the capacitors 201*a* and 201*b*; a second state where the charge accumulated in the capacitor 201*a* is transferred to the third capacitor 201*c*, and a positive output power-supply voltage is held by the charge accumulated in the capacitor 201*b*; a third state where the charge supplied from an input power supply is accumulated in the capacitors 201*a* and 201*b*; and a fourth state where the charge accumulated in the capacitor 201*b* is transferred to the third capacitor 201*c*, and the positive output power-supply voltage $V_{CC}$ is held by the charge accumulated in the capacitor 201*a*.

12 Claims, 12 Drawing Sheets

U.S. PATENT DOCUMENTS

| | | | |
|---|---|---|---|
| 7,991,172 B2 | 8/2011 | Fan et al. | |
| 2005/0012542 A1 | 1/2005 | Kushima et al. | |
| 2005/0047180 A1 | 3/2005 | Kim | |
| 2008/0298605 A1* | 12/2008 | Fan et al. | 381/74 |
| 2011/0084756 A1* | 4/2011 | Saman et al. | 327/536 |
| 2012/0326771 A1* | 12/2012 | MacFarlane | 327/536 |
| 2013/0009696 A1* | 1/2013 | Brown | 327/536 |

FOREIGN PATENT DOCUMENTS

| | | |
|---|---|---|
| JP | 05-091726 | 4/1993 |
| JP | 05-161346 | 6/1993 |
| JP | 06-165482 | 6/1994 |
| JP | 07-327356 | 12/1995 |
| JP | 2001-178115 | 6/2001 |
| JP | 2001-309400 | 11/2001 |
| JP | 2005-039936 | 2/2005 |
| JP | 2005-073495 | 3/2005 |
| JP | 2009-027880 | 2/2009 |
| JP | 2010-130135 | 6/2010 |
| JP | 2010-130136 | 6/2010 |

* cited by examiner

F I G. 2
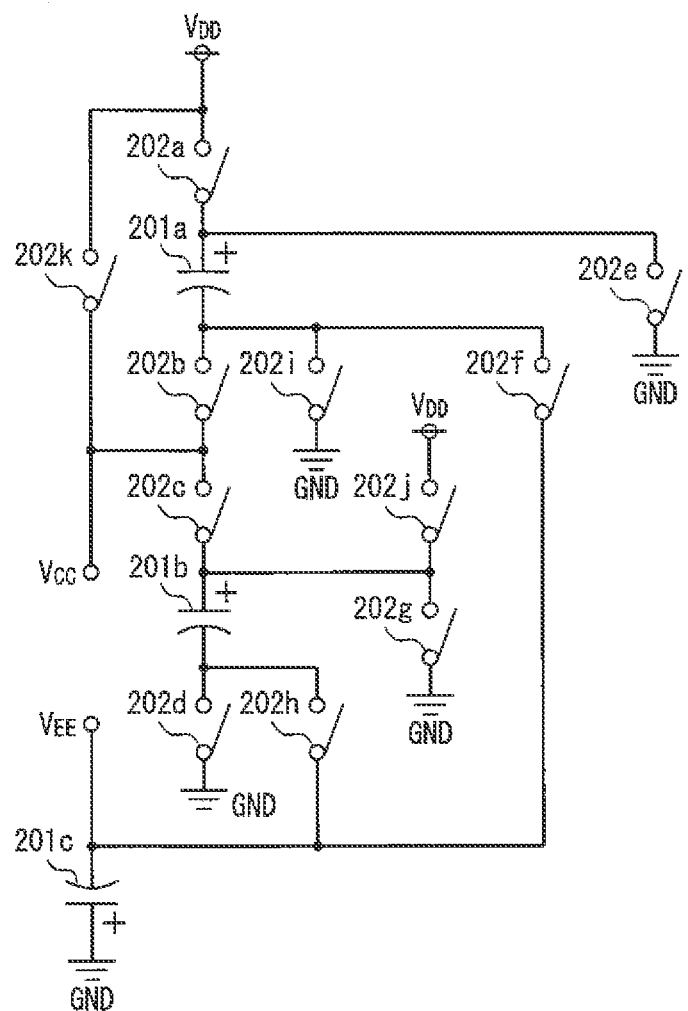

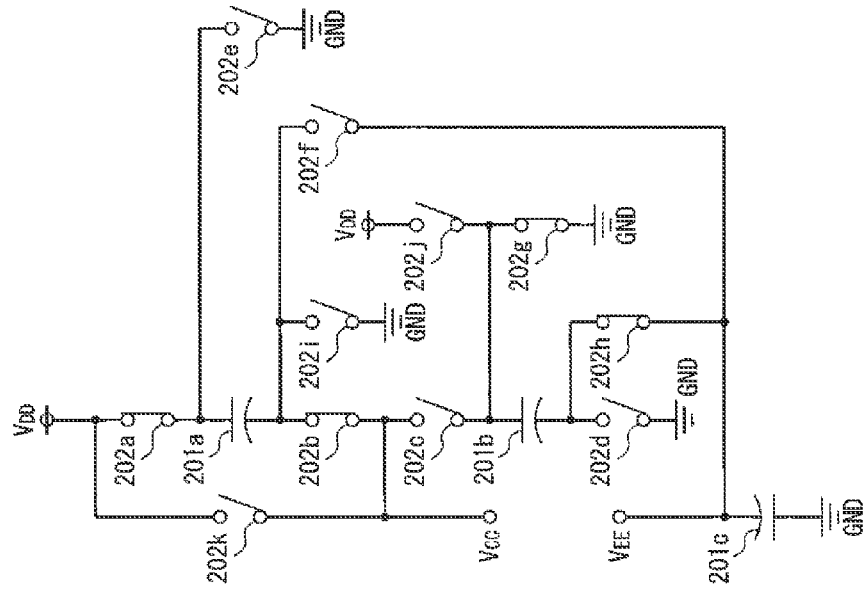
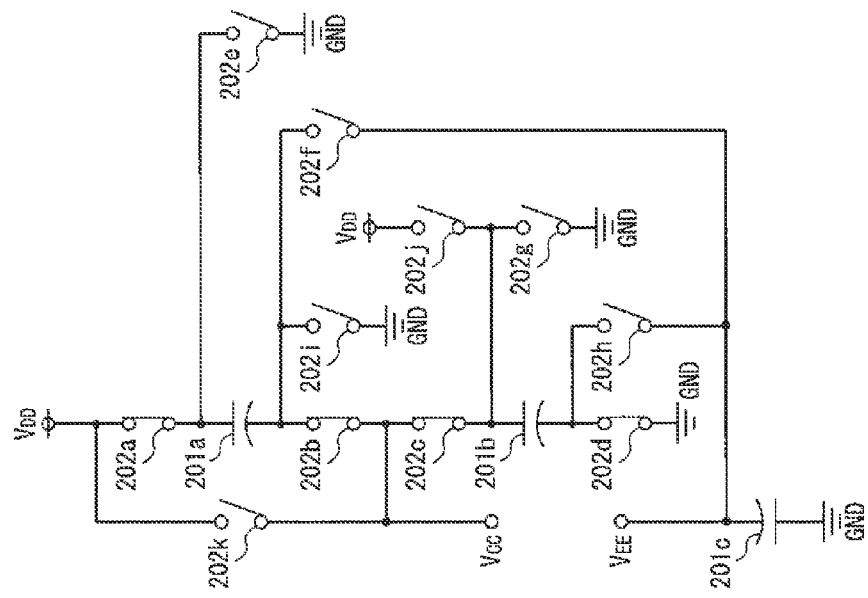

CHARGE PUMP CIRCUIT, CONTROL METHOD THEREOF, AND SEMICONDUCTOR INTEGRATED CIRCUIT

The present application is the national stage application of PCT/JP2011/006300, filed Nov. 10, 2011, which claims priority to Japanese Patent Application No. 2010-253750, filed Nov. 12, 2010, the contents of which are incorporated herein by reference.

TECHNICAL FIELD

The present invention relates to a charge pump circuit for supplying both positive and negative power supply to a driven circuit, a control method thereof, and a semiconductor integrated circuit for driving the charge pump circuit, in particular, to a charge pump circuit capable of generating positive and negative power-supply voltages, control method thereof, and a semiconductor integrated circuit.

BACKGROUND ART

FIG. 11 is a view showing an existing charge pump circuit for driving a video amplifier. The charge pump circuit shown is configured to be a circuit to be driven by a single power supply, which is a positive power supply. Such a charge pump circuit is disclosed by, for example, Patent Document 1.

The existing charge pump circuit shown in FIG. 11 generates a negative power-supply voltage ($V_{EE}$) with a positive power-supply voltage ($V_{DD}$) supplied from a positive power supply and ground voltage (GND). Then, a driven circuit to be driven between the positive power-supply voltage and the negative power-supply voltage directly drives a load without the use of a capacitor for cutting DC (Direct Current) with the ground voltage set as a center level, and outputs signals. In such a charge pump circuit, switching elements 111 and 113 are switched on in a first period of a clock signal, and a capacitor C1 is directly connected between the supplied positive voltage and the ground voltage. In this situation, electric charge is accumulated in the capacitor C1.

In addition, in a second period of the clock signal, the switching elements 111 and 113 are switched off, and simultaneously switching elements 112 and 114 are switched on. In this situation, a capacitor C2 is directly connected between a negative voltage terminal for generating the negative voltage and the ground voltage, and the accumulated electric charge is transferred. The charge pump circuit shown in FIG. 11 repeatedly performs a series of operations as described above to generate the negative voltage.

PRIOR ART DOCUMENT

Patent Document

Patent Document 1: JP 2001-309400 A

Problem to be Solved

In the charge pump circuit of a conventional technique described in Patent Document 1, however, substantially a voltage of $-V_{DD}$ as a negative power-supply voltage is output regardless of the voltage value output from the video amplifier. Therefore, the video amplifier always operates at a power-supply range of $2V_{DD}$, thereby causing a problem that the power consumption of the video amplifier is increased.

The present invention has been made in view of the above circumstances, and has an object to provide a charge pump circuit for generating a power-supply voltage to drive a driven circuit with the generated power-supply voltage to be suitable for reducing the power consumption, a control method thereof, and a semiconductor integrated circuit.

Solution to the Problem

In order to solve the above problem, according to an aspect of the present invention, there is provided a charge pump circuit, to be supplied with electric charge from an input power supply (for example, a power supply connected to $V_{DD}$, as illustrated in FIG. 2), for generating a positive output power-supply voltage (for example, $V_{CC}$, as illustrated in FIG. 2) of a positive output power supply and a negative output power-supply voltage (for example, $V_{EE}$, as illustrated in FIG. 2) of a negative output power supply, the charge pump circuit comprising: a first capacitor (for example, a capacitor 201a, as illustrated in FIG. 2); a second capacitor (for example, a capacitor 201b, as illustrated in FIG. 2) connected in series with the first capacitor; a third capacitor (for example, a capacitor 201c, as illustrated in FIG. 2) for holding the electric charge corresponding to the negative output power-supply voltage; and a switching circuit (for example, switching elements 202a to 202k as illustrated in FIG. 2) for electrically connecting or separating the first capacitor, the second capacitor, and the third capacitor, wherein the switching circuit repeats: a first state (for example, a clock signal CLK1 is high, as illustrated in FIG. 4) in which the charge supplied from the input power supply is accumulated in the first capacitor and the second capacitor connected in series with the first capacitor; a second state (for example, a clock signal CLK2 is high, as illustrated in FIG. 4) in which the charge accumulated in the first capacitor in the first state is transferred to the third capacitor and the positive output power-supply voltage is held by the charge accumulated in the second capacitor; a third state (for example, a clock signal CLK3 is high, as illustrated in FIG. 4) in which the charge supplied from the input power supply is accumulated in the first capacitor and the second capacitor connected in series with the first capacitor; and a fourth state (for example, a clock signal CLK4 is high, as illustrated in FIG. 4) in which the charge accumulated in the second capacitor in the third state is transferred to the third capacitor and the positive output power-supply voltage is held by the charge accumulated in the first capacitor.

In addition, according to an aspect of the present invention, in the above-described charge pump circuit, preferably, the switching circuit (for example, switching elements 202a to 202k, as illustrated in FIG. 2) includes: a first switching unit (for example, switching elements 202a and 202e, as illustrated in FIG. 2) for connecting the input power supply (for example, $V_{DD}$, as illustrated in FIG. 2) or a ground terminal (for example, a terminal of a ground voltage GND, as illustrated in FIG. 2) to an anode terminal of the first capacitor (for example, the capacitor 201a, as illustrated in FIG. 2); a second switching unit (for example, switching elements 202b and 202f, as illustrated in FIG. 2) for connecting the positive output power supply (for example, a power supply for outputting the positive output power-supply voltage $V_{CC}$, as illustrated in FIG. 2) or the negative output power supply (for example, a power supply for outputting the negative output power-supply voltage $V_{EE}$, as illustrated in FIG. 2) to a cathode terminal of the first capacitor; a third switching unit (for example, switching elements 202c and 202g, as illustrated in FIG. 2) for connecting the positive input power supply or the ground terminal to an anode terminal of the second capacitor; and a fourth switching unit (for example, switching elements 202*d* and 202*h*, as illustrated in FIG. 2) for connecting the ground terminal or the negative output power supply to a cathode terminal of the second capacitor.

In addition, according to an aspect of the present invention, in the above-described charge pump circuit, preferably, wherein, in the first state (for example, when the clock signal CLK1 is high, as illustrated in FIG. 2), the switching circuit (for example, switching elements 202*a* to 202*k*, as illustrated in FIG. 2) connects the input power supply (for example, $V_{DD}$, as illustrated in FIG. 2) to the anode terminal of the first capacitor (for example, the capacitor 201*a*, as illustrated in FIG. 2) and connects the positive output power-supply voltage (for example, a power supply for outputting the positive output power-supply voltage $V_{CC}$, as illustrated in FIG. 2) to the cathode terminal of the first capacitor, the switching circuit connects the positive output power supply to the anode terminal of the second capacitor (for example, the capacitor 201*b*, as illustrated in FIG. 2) and connects the ground terminal (for example, the terminal of the ground voltage GND, as illustrated in FIG. 2) to the cathode terminal of the second capacitor, and the switching circuit connects the ground terminal to the anode terminal of the third capacitor (for example, the capacitor 201*c*, as illustrated in FIG. 2) and connects the negative output power supply to the cathode terminal of the third capacitor, wherein, in the second state (for example, the clock signal CLK2 is high, as illustrated in FIG. 4), the switching circuit connects the ground terminal to the anode terminal of the first capacitor and connects the negative output power supply to the cathode terminal of the first capacitor, the switching circuit connects the positive output power supply to the anode terminal of the second capacitor and connects the ground terminal to the cathode terminal of the second capacitor, and the switching circuit connects the ground terminal to the anode terminal of the third capacitor and connects the negative output power supply to the cathode terminal of the third capacitor, wherein, in the third state (for example, the clock signal CLK3 is high, as illustrated in FIG. 4), the switching circuit connects the input power supply to the anode terminal of the first capacitor and connects the positive output power supply to the cathode terminal of the first capacitor, the switching circuit connects the positive output power supply to the anode terminal of the second capacitor and connects the ground terminal to the cathode terminal of the second capacitor, and the switching circuit connects the ground terminal to the anode terminal of the third capacitor and connects the negative output power supply to the cathode terminal of the third capacitor, and wherein, in the fourth state (for example, the clock signal CLK4 is high, as illustrated in FIG. 4), the switching circuit connects the input power supply to the anode terminal of the first capacitor and connects the positive output power supply to the cathode terminal of the first capacitor, the switching circuit connects the ground terminal to the anode terminal of the second capacitor and connects the negative output power supply to the cathode terminal of the second capacitor, and the switching circuit connects the ground terminal to the anode terminal of the third capacitor and connects the negative output power supply to the cathode terminal of the third capacitor.

Furthermore, according to an aspect of the present invention, in the above-described charge pump circuit, preferably, absolute values of the positive output power-supply voltage (for example, $V_{CC}$, as illustrated in FIG. 2) and the negative output power-supply voltage (for example, $V_{EE}$, as illustrated in FIG. 2) are approximately a half a voltage of the input power supply (for example, $V_{DD}$, as illustrated in FIG. 2), by accumulating the charge in the first capacitor (for example, the capacitor 201*a*, as illustrated in FIG. 2), the second capacitor (for example, the capacitor 201*b*, as illustrated in FIG. 2), and the third capacitor (for example, the capacitor 201*c*, as illustrated in FIG. 2).

Moreover, according to an aspect of the present invention, in the above-described charge pump circuit, preferably, the switching circuit further repeats: a fifth state (for example, the clock signal CLK1 or CLK3 is high, as illustrated in FIG. 6) in which the charge supplied from the input power supply is accumulated in the first capacitor, the charge accumulated in the second capacitor is transferred to the third capacitor, and the input power supply is connected to the positive output power supply; and a sixth state (for example, the clock signal CLK2 or CLK4 is high, as illustrated in FIG. 6) in which the charge supplied from the input power supply is accumulated in the second capacitor, the charge accumulated in the first capacitor is transferred to the third capacitor, and the input power supply is connected to the positive output power supply.

In addition, according to an aspect of the present invention, in the above-described charge pump circuit, preferably, wherein the switching circuit (for example, the switching elements 202*a* to 202*k*, as illustrated in FIG. 2) further includes: a fifth switching unit (for example, the switching element 202*k*, as illustrated in FIG. 2) for connecting a terminal into which the input power supply is input and the positive output power supply; a sixth switching unit (for example, the switching element 202*i*, as illustrated in FIG. 2) for connecting the cathode terminal of the first capacitor (for example, the capacitor 201*a*, as illustrated in FIG. 2) and the ground terminal (for example, the terminal of the ground voltage GND, as illustrated in FIG. 2); and a seventh switching unit (for example, the switching element 202*j*, as illustrated in FIG. 2) for connecting the anode terminal of the second capacitor and the input power supply.

Furthermore, according to an aspect of the present invention, in the above-described charge pump circuit, preferably, in the fifth state (for example, the clock signal CLK1 or CLK3 is high, as illustrated in FIG. 6), the switching circuit (for example, the switching elements 202*a* to 202*k*, as illustrated in FIG. 2) connects the input power supply (for example, $V_{DD}$, as illustrated in FIG. 2) to the anode terminal of the first capacitor (for example, the capacitor 201*a*, as illustrated in FIG. 2) and connects the ground terminal (for example, the terminal of the ground voltage GND, as illustrated in FIG. 2) to the cathode terminal of the first capacitor, the switching circuit connects the ground terminal to the anode terminal of the second capacitor (for example, the capacitor 201*b*, as illustrated in FIG. 2) and connects the negative output power supply (for example, the power supply for outputting the negative power-supply voltage $V_{EE}$, as illustrated in FIG. 2) to the cathode terminal of the second capacitor, and the switching circuit connects the ground terminal to the anode terminal of the third capacitor (for example, the capacitor 201*c*, as illustrated in FIG. 2), connects the negative output power supply to the cathode terminal of the third capacitor, and connects the input power supply to the positive output power supply, and wherein, in the sixth state (for example, the clock signal CLK2 or CLK4 is high, as illustrated in FIG. 6), the switching circuit connects the ground terminal to the anode terminal of the first capacitor and connects the negative output power supply to the cathode terminal of the first capacitor, the switching circuit connects the input power supply to the anode terminal of the second capacitor and connects the ground terminal to the cathode terminal of the second capacitor, and the switching circuit connects the ground terminal to the anode terminal of the third capacitor, connects the negative output power supply to the cathode terminal of the third capacitor, and connects the input power supply to the positive output power supply.

Moreover, according to an aspect of the present invention, in the above-described charge pump circuit, preferably, absolute values of the positive output power-supply voltage (for example, $V_{CC}$, as illustrated in FIG. 2) and the negative output power-supply voltage (for example, $V_{EE}$, as illustrated in FIG. 2) are approximately same with a voltage of the input power supply (for example, $V_{DD}$, as illustrated in FIG. 2), by accumulating the charge in the first capacitor (for example, the capacitor 201a, as illustrated in FIG. 2), the second capacitor (for example, the capacitor 201b, as illustrated in FIG. 2), and the third capacitor (for example, the capacitor 201c, as illustrated in FIG. 2).

In addition, according to an aspect of the present invention, in the above-described invention, there is provided a semiconductor integrated circuit so that the charge pump circuit is operated to repeat the first state to the fourth state, when a differential voltage between the positive output power-supply voltage and a value of an output signal voltage of an amplifier that operates by the positive output power-supply voltage (for example, $V_{CC}$, as illustrated in FIG. 2) and the negative output power-supply voltage (for example, $V_{EE}$, as illustrated in FIG. 2), and a differential voltage between a value of the output signal voltage and a value of the negative output power-supply voltage are both higher than a preset reference voltage, and further comprises a mode detecting circuit (for example, a mode detecting circuit 7, as illustrated in FIG. 1) for operating the charge pump circuit according to any one of claim 5 to claim 8 to repeat the fifth state and the sixth state, when any one of the differential voltages is lower than a preset reference voltage.

Furthermore, according to an aspect of the present invention, in the above-described semiconductor integrated circuit, preferably, the charge pump circuit is operated to repeat the first state to the fourth state, when an absolute value of a differential voltage between a value of an output signal voltage from an amplifier that operates by the positive output power-supply voltage and the negative output power-supply voltage and a value of ground voltage is lower than a preset reference voltage, further comprising a mode detecting circuit (for example, the mode detecting circuit 7, as illustrated in FIG. 1) for operating the charge pump circuit according to any one of claim 5 to claim 8 to repeat the fifth state and the sixth state, when the absolute value of the differential voltage is higher than a preset reference voltage.

In addition, according to an aspect of the present invention, there is provided a control method of a charge pump circuit, to be supplied with electric charge from an input power supply, for generating a positive output power-supply voltage of a positive output power supply and a negative output power-supply voltage of a negative output power supply, the charge pump circuit comprising: a first capacitor; a second capacitor connected in series with the first capacitor; and a third capacitor for holding the electric charge corresponding to the negative output power-supply voltage, the control method repeats: a first state in which the charge supplied from the input power supply is accumulated in the first capacitor and the second capacitor connected in series with the first capacitor; a second state in which the charge accumulated in the first capacitor in the first state is transferred to the third capacitor and the positive output power-supply voltage is held by the charge accumulated in the second capacitor; a third state in which the charge supplied from the input power supply is accumulated in the first capacitor and the second capacitor connected in series with the first capacitor; and a fourth state in which the charge accumulated in the second capacitor in the third state is transferred to the third capacitor and the positive output power-supply voltage is held by the charge accumulated in the first capacitor.

Furthermore, according to an aspect of the present invention, in the above-described control method of the charge pump circuit, preferably, the method repeats: a fifth state in which the charge supplied from the input power supply is accumulated in the first capacitor, the charge accumulated in the second capacitor is transferred to the third capacitor, and the input power supply is connected to the positive output power supply; and a sixth state in which the charge supplied from the input power supply is accumulated in the second capacitor, the charge accumulated in the first capacitor is transferred to the third capacitor, and the input power supply is connected to the positive output power supply.

Advantageous Effects of the Invention

According to the above-described present invention, it is possible to generate positive and negative output power supplies in the charge pump circuit. In addition, such a charge pump circuit can be configured with switching elements and capacitors. Furthermore, in the above charge pump circuit, absolute values of the voltages supplied from the positive and negative output power supplies are made to a half an input voltage, so that the power consumption from the load driving system can be reduced. This is exhibited that the output current of 2I is made available from input current of I, by converting the input power of $V_{DD} \times I$ into the power of ½ $V_{DD} \times$ 2I.

In addition, according to the above-described invention, it is further possible to generate other positive and negative output power supplies in the charge pump circuit. Furthermore, such a charge pump circuit can be configured with switching elements and capacitors. Moreover, in the above-described charge pump circuit, the absolute value of the voltage supplied from the positive and negative output power supplies can be made to the same value with the input voltage. In this situation, the charge accumulation and the charge transfer of two capacitors are performed complementarily when the negative voltage is generated. Therefore, the charge pump circuit according to the present invention has a double capability of supplying current as compared to the conventional charge pump circuit.

Moreover, according to the above-described invention, when a signal output from a driven circuit to be driven by a charge pump circuit to a load is relatively small, it is possible to make small the voltage value supplied from an output power supply, whereas when the signal is relatively great, it is possible to make greater the voltage value supplied from an output power supply. Accordingly, it is made possible to switch the power consumption of a load driving system as needed.

BRIEF DESCRIPTION OF THE DRAWINGS

FIG. 2 is a circuit diagram illustrative of a detailed configuration of a charge pump circuit illustrated in FIG. 1;

FIGS. 3-2C and 3-2D are diagrams illustrative of another operation state of the charge pump circuit in mode 1 according to an embodiment of the present invention;

DESCRIPTION OF EMBODIMENTS

Hereinafter, a charge pump circuit, a control method thereof, and a semiconductor integrated circuit according to an embodiment of the present invention will be described with reference to the drawings. In the present embodiment, the charge pump circuit according to the present embodiment is applied to an amplifier circuit that is a driven circuit. A description will be given of a load driving system configured with the amplifier circuit for amplifying an input signal to supply it to a load.

(Circuit Configuration)

Figure 1:
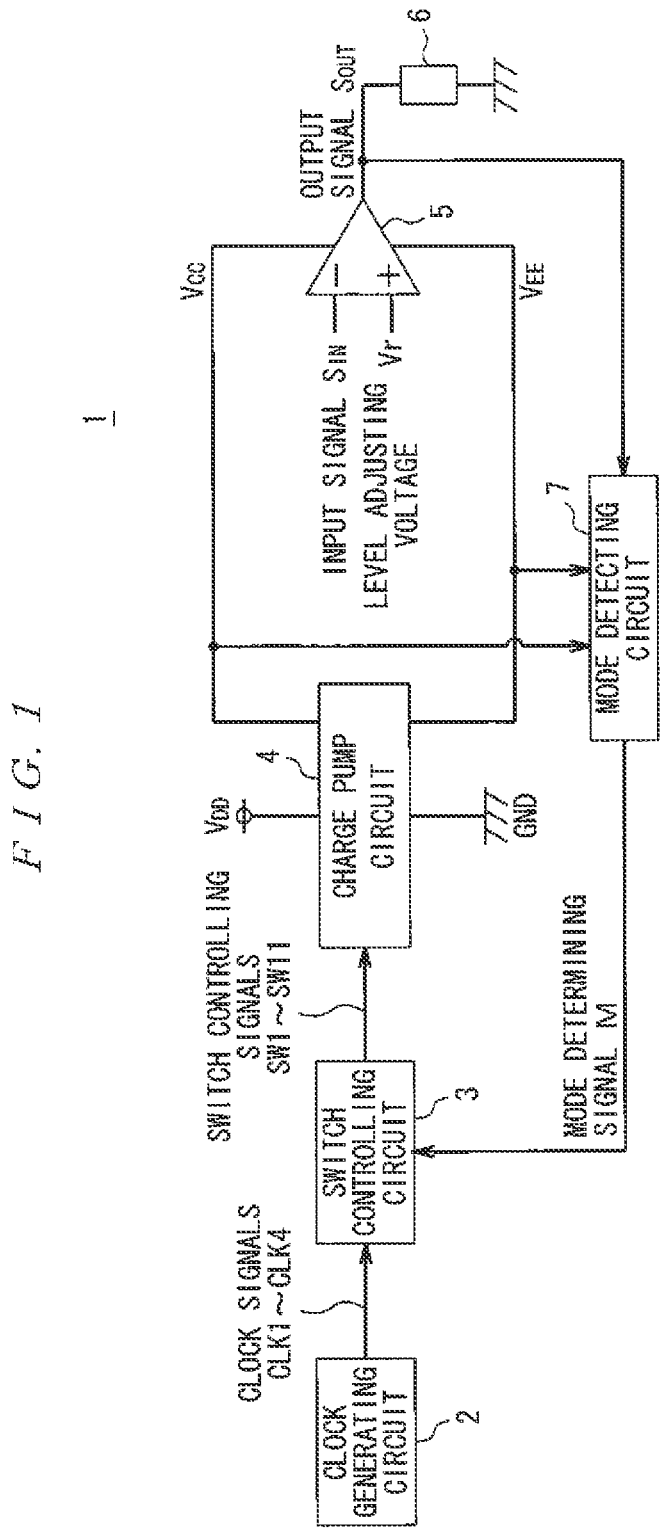
FIG. 1 is a block diagram illustrative of the load driving system according to an embodiment of the present invention.

FIG. 1 is a block diagram illustrative of the load driving system according to the present embodiment. Referring to FIG. 1, a load driving system 1 includes: a clock generating circuit 2; a switch controlling circuit 3; a charge pump circuit 4; an amplifier circuit 5; a load 6; and a mode detecting circuit 7. The charge pump circuit 4 has a function of generating a positive output power-supply voltage $V_{CC}$ and a negative output power-supply voltage $V_{EE}$ from a positive input power-supply voltage $V_{DD}$, in a charge pump system configured with capacitors and switching elements. Such a charge pump circuit 4 will be described later in detail.

The clock generating circuit 2 outputs clock signals CLK1 to CLK4. The output clock signals CLK1 to CLK4 are input into the switch controlling circuit 3. The switch controlling circuit 3 generates switch controlling signals SW1 to SW11 based upon the clock signals CLK1 to CLK4, and outputs the switch controlling signals SW1 to SW11 to the charge pump circuit 4. The switch controlling signals SW1 to SW11 are signals for controlling multiple switching elements, respectively, provided in the charge pump circuit 4.

The charge pump circuit 4 outputs the positive output power-supply voltages $V_{CC}$ and $V_{EE}$ by switching the switches, and the output power-supply voltages $V_{CC}$ and $V_{EE}$ are supplied to the amplifier circuit 5. The amplifier circuit 5 outputs an output signal $S_{OUT}$ from the supplied output power-supply voltages $V_{CC}$ and $V_{EE}$, an input signal $S_{IN}$, and a level adjusting voltage $V_r$. The load 6 is connected to a terminal to which the output signal $S_{OUT}$ is output.

In addition, the charge pump circuit 4 has two switching modes, and the load driving system 1 is provided with the mode detecting circuit 7 for detecting the mode in which the charge pump circuit 4 is to operate. The mode detecting circuit 7 receives the output signal $S_{OUT}$ and the output power-supply voltages $V_{CC}$ and $V_{EE}$, and generates a mode determining signal M based upon the output signal $S_{OUT}$ and the output power-supply voltages $V_{CC}$ and $V_{EE}$. The mode determining signal M is input into the switch controlling circuit 3, and the switch controlling circuit 3 generates the switch controlling signals SW1 to SW11 according to the mode determining signal M.

When the mode determining signal M is a low level, the charge pump circuit 4 operates in mode 1, and the absolute values of the output power-supply voltages $V_{CC}$ and $V_{EE}$ are equal to approximately a half the input power-supply voltage $V_{DD}$. When the mode determining signal is a high level, the charge pump circuit 4 operates in mode 2. In this case, the absolute values of the output power-supply voltages $V_{CC}$ and $V_{EE}$, which are output at this time, are approximately equal to the input power-supply voltage $V_{DD}$.

The clock generating circuit 2 is provided with an oscillator such as a crystal oscillator, ceramic oscillator, or the like, and has a function of generating four types of clock signals CLK1, CLK2, CLK3, and CLK4 for controlling on and off of the switching elements included in the charge pump circuit 4. Specifically, CLK1 to CLK4 are signals each having the same cycle and same amplitude, and the level thereof becomes higher sequentially from CLK1. In this situation, the other three signals are each a low level.

The clock signals CLK1 to CLK4 and the mode determining signal M are input into the switch controlling circuit 3. Then, the switch control signals SW1 to SW11 for controlling on and off of the switches based upon the clock signals CLK1 to CLK4 and the mode determining signal M are supplied to the charge pump circuit 4.

The amplifier circuit 5 is an inverting amplifier circuit including an operational (OP) amplifier, and has a function of outputting the output signal $S_{OUT}$ in which a differential signal between the input signal $S_{IN}$ input into the inverting input terminal (indicated by "−" in the drawing) and a level adjusting voltage $V_r$ of an offset voltage input into a non-inverting input terminal (indicated by "+" in the drawing) is inverted and amplified.

The load 6 is a load to be driven by the output signal OUT output from the amplifier circuit 5. Examples of the load 6 are speakers or headphones. In this case, the input signal $S_{IN}$ is an audio input signal. In addition, the load 6 also corresponds to a buffer circuit or the like for driving the speakers or headphones.

FIG. 2 is a circuit diagram illustrative of a configuration of the charge pump circuit 4 illustrated in FIG. 1, in more detail. The charge pump circuit 4 illustrated in FIG. 2 includes: capacitors 201a to 201c; and switching elements 202a to 202k. Additionally, the terminal indicated by $V_{DD}$ in FIG. 2 is a terminal connected to the input power supply. The terminal indicated by $V_{CC}$ is a terminal into which the positive output power-supply voltage $V_{CC}$ is input, whereas the terminal indicated by $V_{EE}$ is a terminal into which the negative output power-supply voltage $V_{EE}$ is input.

In the present embodiment, hereinafter, a description will be given such that a terminal $V_{DD}$ is a terminal connected to the input power supply, a terminal $V_{CC}$ is a terminal connected to a positive output power supply, and a terminal $V_{EE}$ is a terminal connected to a negative output power supply. In addition, being connected to the terminal $V_{DD}$ means electrical connection with the terminal into which the input power-supply voltage $V_{DD}$ is input, and being connected to the terminal $V_{CC}$ means electrical connection with the terminal into which the output power-supply voltage $V_{CC}$ is input. Furthermore, being connected to the terminal $V_{EE}$ means electrical connection with the terminal into which the negative output power-supply voltage $V_{EE}$ is input.

In the present embodiment, switching elements 202d to 202i are each configured with an N-channel MOS transistor. However, the present embodiment is not limited to the switching elements 202d to 202i each configured with an N-channel MOS transistor. The switching elements 202d to 202i may be each configured with a P-channel MOS transistor.

Moreover, in the present embodiment, switching elements 202a to 202c, 202j, and 202k are each configured with a P-channel MOS transistor. However, the present embodiment is not limited to the switching elements 202a to 202c, 202j, and 202k each configured with the P-channel MOS transistor. The switching elements 202a to 202c, 202j, and 202k may be each configured with an N-channel MOS transistor.

The anode terminal of the capacitor 201a is electrically connected to the switching element 202a and the drain terminal of the switching element 202e, respectively. The source terminal of the switching element 202a is connected to the terminal $V_{DD}$. The source terminal of the switching element 202e is electrically connected to the terminal of the ground voltage GND.

Additionally, the cathode terminal of the capacitor 201a is electrically connected to the source terminal of the switching element 202b, and the drain terminal of the switching element 202f and the switching element 202i, respectively. The drain terminal of the switching element 202b is connected to the terminal $V_{CC}$. The source terminal of the switching element 202f is connected to the terminal $V_{EE}$, and the source terminal of the switching element 202i is electrically connected to the terminal of the ground voltage GND.

The anode terminal of the capacitor 201b is electrically connected to the drain terminals of the switching elements 202c, 202g, and 202j, respectively. The source terminal of the switching element 202c is connected to the terminal V. The source terminal of the switching element 202g is electrically connected to the ground voltage GND. The source terminal of the switching element 202j is connected to the terminal $V_{DD}$.

The cathode terminal of the capacitor 201b is electrically connected to the drain terminals of the switching elements 202d and 202h, respectively. The source terminal of the switching element 202d is electrically connected to the terminal of the ground voltage GND. The source terminal of the switching element 202h is connected to the terminal $V_{EE}$.

The anode terminal of the capacitor 201c is electrically connected to the terminal of the ground voltage GND, and the cathode terminal thereof is connected to the terminal $V_{EE}$. The source terminal of the switching element 202k is connected to the terminal $V_{DD}$, and the drain terminal thereof is connected to the terminal $V_{CC}$. Specifically, the potential of the ground voltage GND is maintained at the ground voltage (0 [V]).

(Operations)

Next, operations in mode 1 and mode 2 of the charge pump circuit 4 according to the present embodiment will be described independently.

Mode 1

Figures 1A, 3:
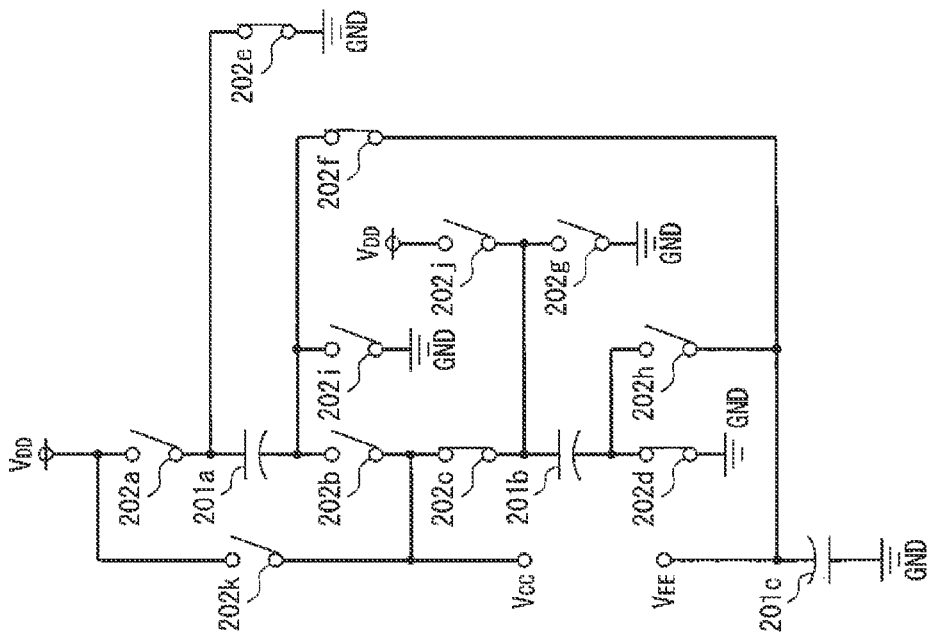
FIGS. 3-1A and 3-1B are diagrams illustrative of an operation state of the charge pump circuit in mode 1 according to an embodiment of the present invention.
Figure 4:
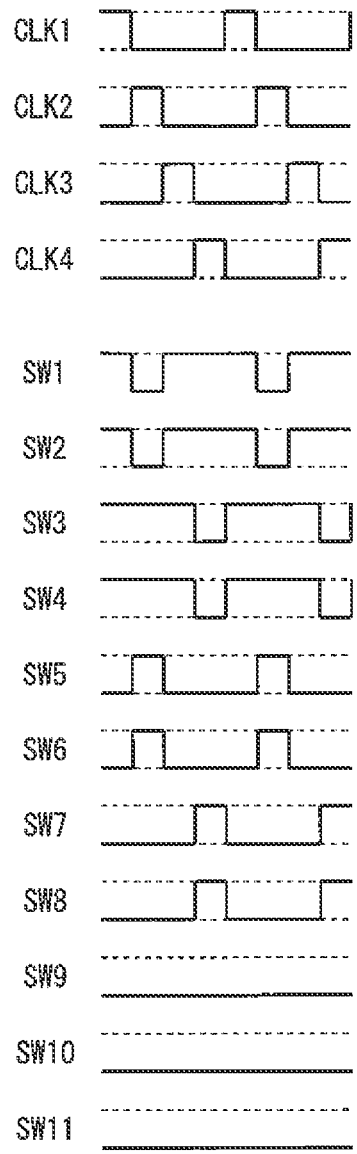
FIG. 4 is a view illustrative of the clock signals in mode 1 and switch controlling signals to be input into the charge pump circuit according to an embodiment of the present invention.

FIG. 3-1 and FIG. 3-2 are diagrams illustrative of operation states of the charge pump circuit 4 in mode 1. FIG. 4 is a view illustrative of the clock signals CLK1 to CLK4 in mode 1 and the switch controlling signals SW1 to SW11 to be input into the charge pump circuit 4. The switch controlling signals SW1 to SW11 respectively correspond to control signals of the switching elements 202a to 202k. The switch is switched on when the control signal is a high level, whereas the switch is switched off when the control signal is a low level. As illustrated, the clock signals CLK1 to CLK4 are pulse signals having different phases from each other.

Out of the switch controlling signals SW1 to SW8, the switch controlling signals SW1 and SW2 are pulse signals having the same phase, and the switch controlling signals SW3 and SW4 are pulse signals having the same phase. In addition, the switch controlling signals SW5 and SW6 are pulse signals having the same phase, and the switch controlling signals SW7 and SW8 are pulse signals having the same phase. Furthermore, the switch controlling signals SW1 and SW2, and the switch controlling signals SW5 and SW6 are pulse signals having the opposite phases, and the switch controlling signals SW3 and SW4, and the switch controlling signals SW7 and SW8 are pulse signals having the opposite phases. The switch controlling signals SW9, SW10, and SW11 are signals each always having a constant value, and are always low.

Figures 1B, 3:
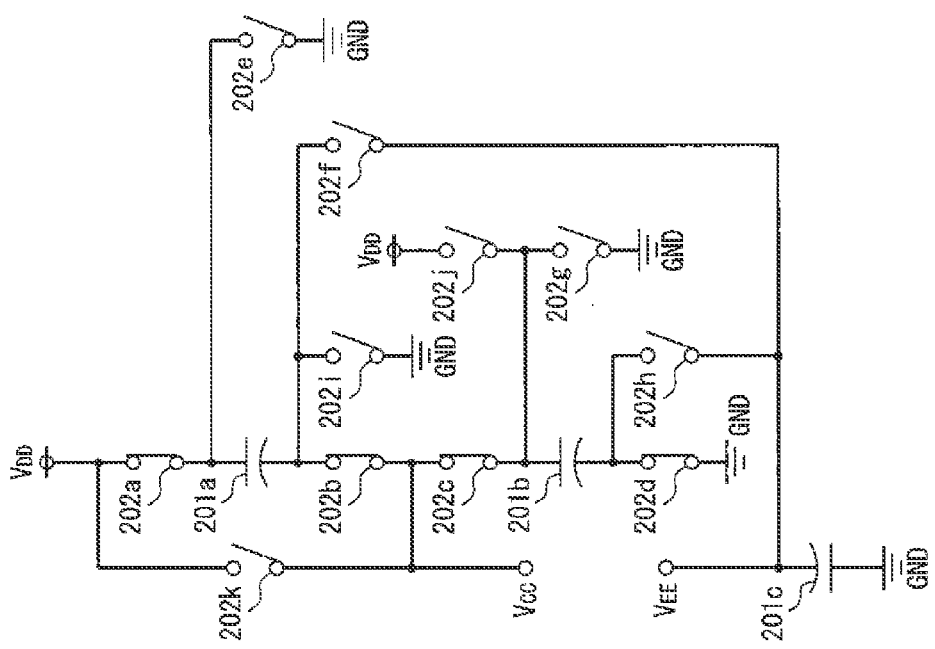

FIG. 3-1A is a view illustrative of on and off states of the switching elements 202a to 202k when the clock signal CLK1 is a high level (hereinafter, referred to "high"), and FIG. 3-1B is a view illustrative of on and off states of the switching elements 202a to 202k when the clock signal CLK2 is high. FIG. 3-2C is a view illustrative of on and off states of the switching elements 202a to 202k when the clock signal CLK3 is high, and FIG. 3-2D is a view illustrative of on and off states of the switching elements 202a to 202k when the clock signal CLK4 is high. However, in FIG. 3-1 and FIG. 3-2, the polarities of the MOS transistors constituting the switching elements have been described with reference to FIG. 2.

As illustrated in the drawing, when the clock signal CLK1 output from the clock generating circuit 2 is high, the switching elements 202a to 202d are switched on and the switching elements 202e to 202k are switched off in the charge pump circuit 4. In this situation, a path from the terminal $V_{DD}$, the switching element 202a, the switching element 202b, the capacitor 201a, the switching element 202c, the capacitor 201b, the switching element 202d to GND is established, and the capacitors 201a and 201b connected in series are charged.

In addition, when the clock signal CLK2 is high, the switching elements 202c to 202f are switched on and the switching elements 202a, 202b, and 202g to 202k are switched off in the charge pump circuit 4. In this situation, a closed loop from GND, the switching element 202e, the capacitor 201a, the switching element 202f, the capacitor 201c to GND is established, and the electric charge accumulated in the capacitor 201a is transferred to the capacitor 201c. In this situation, the positive output power-supply voltage $V_{CC}$ is held by the capacitor 201b.

When the clock signal CLK3 is high, the switching elements 202a to 202d are switched on and the switching elements 202e to 202k are switched off in the charge pump circuit 4. In this situation, in the same manner as the case where the clock signal CLK1 is high, the path from the terminal $V_{DD}$, the switching element 202a, the capacitor 201a, the switching element 202b, the switching element 202c, the capacitor 201b, the switching element 202d to GND is established, and the capacitors 201a and 201b are charged.

When the clock signal CLK4 is high, the switching elements 202a, 202b, 202g, and 202h are switched on and the switching elements 202c to 202f and the switching elements 202i to 202k are switched off in the charge pump circuit 4. In this situation, a closed loop from GND, the switching element 202g, the capacitor 201b, the switching element 202h, the capacitor 201c to GND is established, and the electric charge accumulated in the capacitor 201b is transferred to the capacitor 201c. In this situation, the positive output power-supply voltage $V_{CC}$ is held by the capacitor 201a.

Specifically, in the above description, the switching elements 202b, 202d, 202f, 202h, and 202i are subject to level shift appropriately to switch on and off the path in a negative voltage region.

Switching of the above-described four states repeatedly continues in response to the switching timings of the clock signals CLK1 to CLK4. In the present embodiment, a positive voltage can be generated between the terminal of the ground voltage GND and the terminal $V_{CC}$, such that the positive voltage has the same polarity with the input power-supply voltage $V_{DD}$ and has a substantially same level with the voltage which has a value approximately a half thereof. In addition, a negative voltage can be generated between the terminal of the ground voltage GND and the terminal $V_{EE}$, such that the negative voltage has the opposite polarity with the input power-supply voltage $V_{DD}$ and has a substantially same level with the voltage which has a value approximately a half thereof.

Mode 2

Next, operations of mode 2 performed in the charge pump circuit 4 according to the present embodiment will be described.

Figure 5:
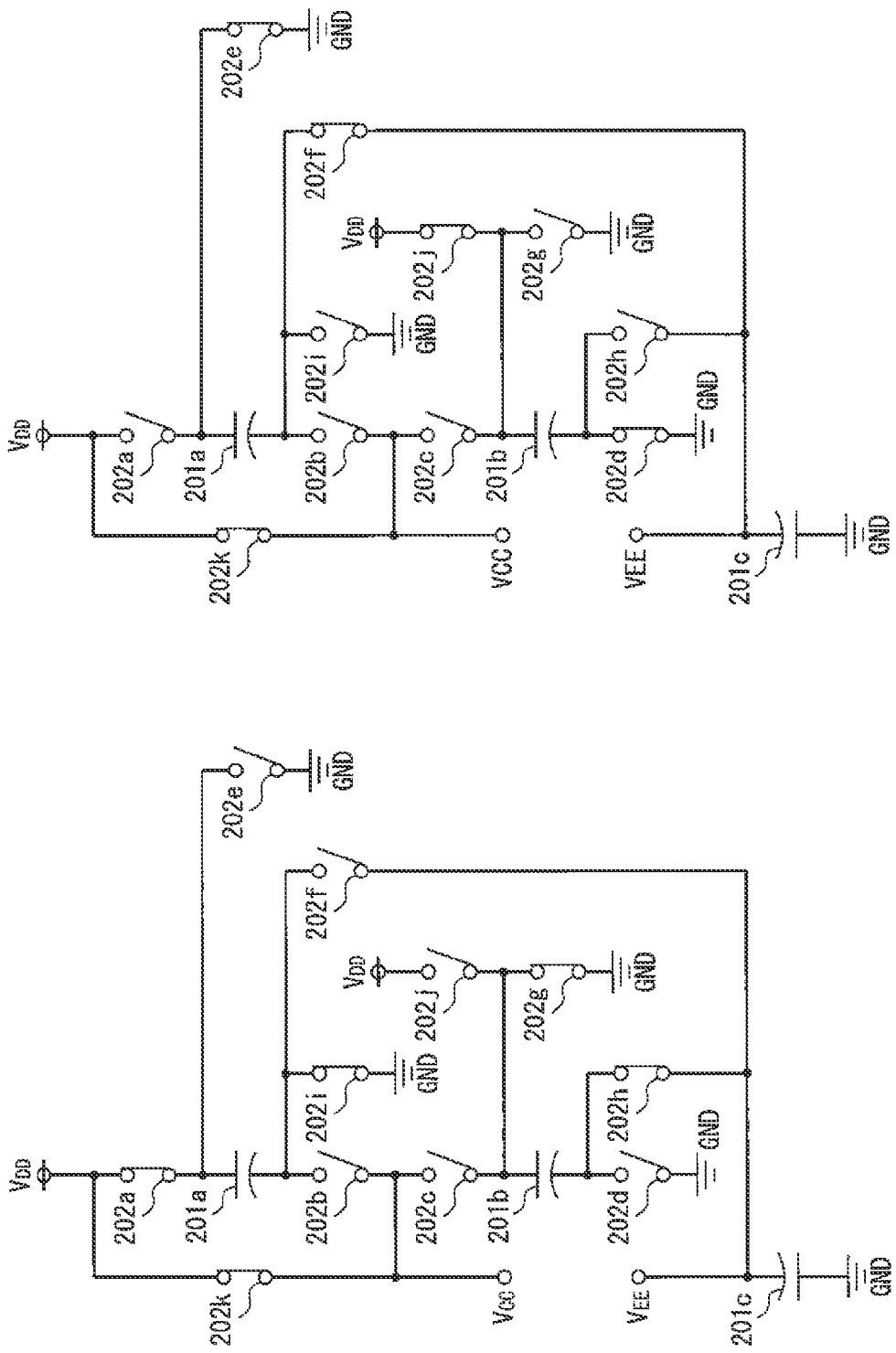
FIGS. 5A and 5B are views illustrative of an operation state of the charge pump circuit in mode 2 according to an embodiment of the present invention.

FIG. 5 is a view illustrative of an operation state of the charge pump circuit 4 in mode 2. FIG. 5A illustrates on and off states of the switching elements 202a to 202k when the clock signal CLK1 or the clock signal CLK3 is high. FIG. 5B illustrates on and off states of the switching elements 202a to 202k when the clock signal CLK2 or the clock signal CLK4 is high. In FIG. 5, the polarities of the MOS transistors constituting the switching elements have been described with reference to FIG. 2.

Figure 6:
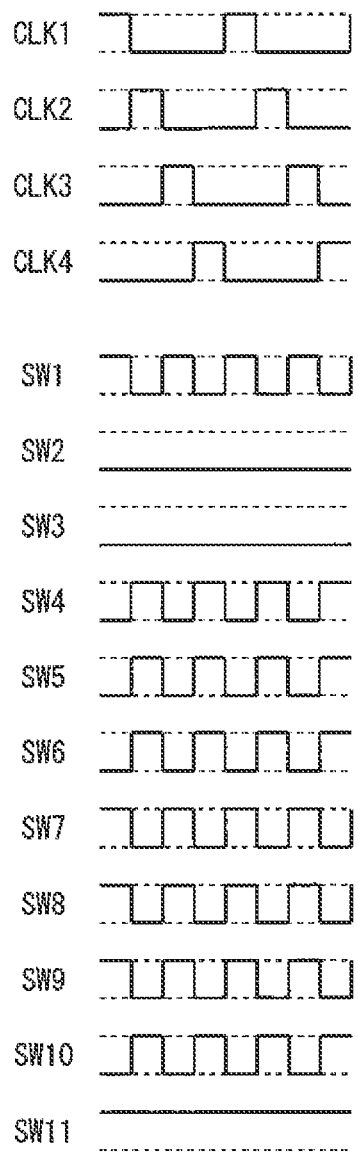
FIG. 6 is a view illustrative of the clock signals in mode 2 and the switch controlling singles to be input into the charge pump circuit according to an embodiment of the present invention.

FIG. 6 is a view illustrative of the clock signals CLK1 to CLK4 in mode 2 and the switch controlling signals SW1 to SW11 to be input into the charge pump circuit 4. The switch controlling signals SW1 to SW11 respectively correspond to control signals of the switching elements 202a to 202k. The switch is switched on at a high level, and the switch is switched off at a low level. The clock signals CLK1 to CLK4 illustrated in FIG. 6 are same with the clock signals CLK1 to CLK4 illustrated in FIG. 4. However, in mode 2, the switch controlling signals SW1 to SW11 to be output by the switch controlling circuit 3 based upon the clock signals CLK1 to CLK4 are different from those in mode 1.

That is to say, out of the switch controlling signals SW1 to SW11 in mode 2, the switch controlling signals SW4 to SW6 and the switch controlling signal SW10 are signals having the same phase, and the switch controlling signal SW1 and the switch controlling signals SW7 to SW9 are signals having the same phase. Then, the switch controlling signals SW4 to SW6 and SW10 are pulse signals having opposite phases from those of the switch controlling signals SW1 and SW7 to SW9. The switch controlling signals SW2, SW3, and SW11 are signals each having a certain value, and the switch controlling signals SW2 and SW3 are always low and the switch controlling signal SW11 is always high.

In such mode 2, when the clock signal CLK1 or CLK3 is high, the switching elements 202a, 202g to 202i, and 202k are switched on, and the switching elements 202b to 202f and 202j are switched off.

In addition, when the clock signal CLK2 or CLK4 is high, the switching elements 202d to 202f, 202j, and 202k are switched on, and the switching elements 202a to 202c and 202g to 202i are switched off. However, the switching elements 202b, 202d, 202f, 202h, and 202i are subject to level shift appropriately to switch on and off the path in a negative voltage region.

In the charge pump circuit 4 in mode 2, when the switching elements 202a and 202g to 202i are switched on, a path from the terminal $V_{DD}$, the switching element 202a, the capacitor 201a, the switching element 202i to GND is established. In this situation, the capacitor 201a is charged.

In addition, when the switching elements 202a and 202g to 202i are switched on, a closed loop from GND, the switching element 202g, the capacitor 201b, the switching element 202h, the capacitor 201c to GND is established. In this situation, the electric charge accumulated in the capacitor 201b is transferred to the capacitor 201c.

Furthermore, when the switching elements 202d to 202f and 202j are switched on, a path from the terminal $V_{DD}$, the switching element 202j, the capacitor 201b, the switching element 202d to GND is established, and the capacitor 201b is charged. Moreover, the switching elements 202d to 202f and 202j are switched on, a closed loop from GND, the switching element 202e, the capacitor 201a, the switching element 202f, the capacitor 201c to GND is established. In this situation, the electric charge accumulated in the capacitor 201a is transferred to the capacitor 201c.

In addition, the switching element 202k is always switched on, a path from the terminal $V_{DD}$, the switching element 202k to the terminal $V_{CC}$ is established, and $V_{CC}$ has a substantially same potential to VDD.

Figure 11:
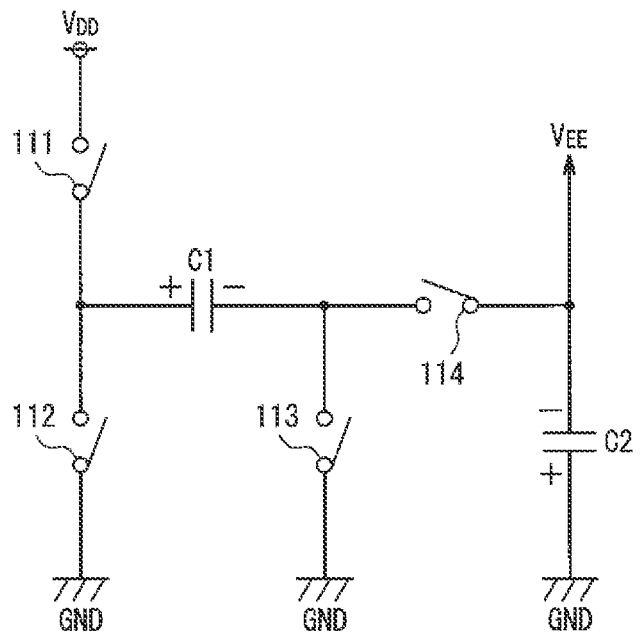
FIG. 11 shows an existing charge pump circuit for driving a video amplifier.

In mode 2, switching of the above-described two states are repeatedly performed in accordance with the switching timings of the clock signals CLK1 to CLK4. Thus, a positive voltage having can be generated between the terminal of the ground voltage GND and the terminal $V_{CC}$, such that the positive voltage has the same polarity with the input power-supply voltage $V_{DD}$ and has a substantially same level with the voltage which has an approximately same value. Furthermore, a negative voltage can be generated between the terminal of the ground voltage GND and the terminal $V_{EE}$, such that the negative voltage has the opposite polarity with the input power-supply voltage $V_{DD}$ and has a substantially same level with the voltage which has an approximately same value. In this situation, the capacitor 201a and the capacitor 201b complementarily operate. Therefore, in the present embodiment, it is possible to provide the charge pump circuit 4 having a greater capability of supplying current than that of the conventional charge pump circuit shown in FIG. 11.

Moreover, each state is successively repeated in the above-described mode 1 and mode 2. Accordingly, in the charge pump circuit 4 according to the present embodiment, the positive output power-supply voltage $V_{CC}$ and the negative output power-supply voltage $V_{EE}$ are generated. In particular, the positive output power-supply voltage $V_{CC}$ and the negative output power-supply voltage $V_{EE}$ in mode 1 and the negative output power-supply voltage $V_{EE}$ in mode 2 repeat minute fluctuations in a voltage region where rises and drops are balanced. However, minute fluctuations of the generated positive output power-supply voltage $V_{CC}$ and the negative output power-supply voltage $V_{EE}$ can be absorbed by providing the capacitors 201a to 201c each having an appropriate capacitance value in the charge pump circuit 4.

Specifically, the appropriate capacitance values of the capacitors 201a to 201c are determined depending on the magnitude or the like of the load 6 to be driven by the charge pump circuit 4. Generally, 0.01 µF-100 µF, preferably, 0.1 µF-10 µF, and more preferably, approximately 1 µF.

The amplifier circuit 5 illustrated in FIG. 1 is driven by a power supply for outputting the positive output power-supply voltage $V_{CC}$ generated and supplied by the charge pump circuit 4 and by the negative power supply for outputting the negative output power-supply voltage $V_{EE}$. When the amplifier circuit 5 is driven, the amplifier circuit 5 inverts and amplifies the input signal $S_{IN}$ with the level adjusting voltage $V_r$ set as a center, and outputs the output signal $S_{OUT}$ with the ground voltage (0 V) set as a center. With this configuration, the output signal $S_{OUT}$ is output over an upper and lower voltage range of the ground voltage, so that the load 6 can be driven sufficiently.

The mode detecting circuit 7 detects the positive output power-supply voltage $V_{CC}$, the negative output power-supply voltage $V_{EE}$, and the output signal $S_{OUT}$, and outputs the mode determining signal M for determining whether the charge pump circuit 4 operates in mode 1 or in mode 2 to the switch controlling circuit 3.

Figure 7A:
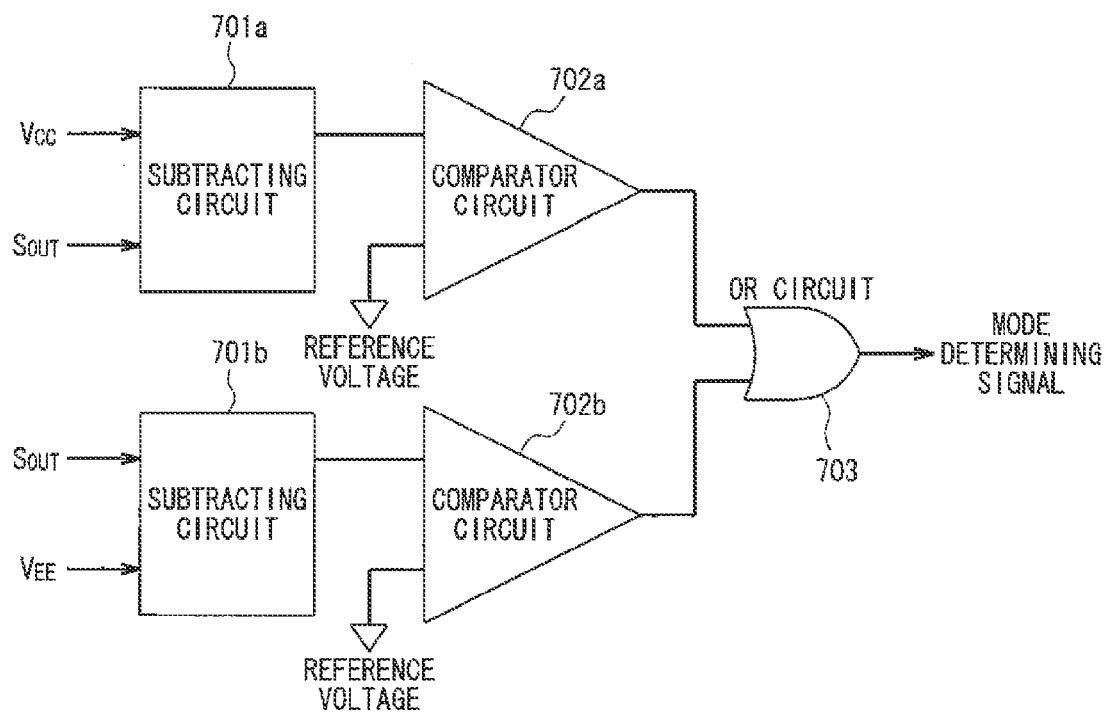
FIGS. 7A and 7B are views illustrative of a configuration example of a mode detecting circuit illustrated in FIG. 1 in more detail, and is a view illustrative of relationships between output power-supply voltages $V_{EE}$ and $V_{CC}$ and an output signal $S_{OUT}$.

FIG. 7A is a view illustrative of a configuration of the mode detecting circuit 7 illustrated in FIG. 1 in more detail. The mode detecting circuit 7 is provided with: subtracting circuits 701a and 701b; comparator circuits 702a and 702b; and an OR circuit 703. Then, the subtracting circuit 701a detects a differential voltage between the positive output power-supply voltage $V_{CC}$ and the output signal $S_{OUT}$ from the amplifier circuit 5. In addition, the subtracting circuit 701b detects a differential voltage between the output signal $S_{OUT}$ and the negative output power-supply voltage $V_{EE}$. Furthermore, by use of the comparator circuits 702a and 702b, the values of the differential voltages are respectively compared with a preset reference voltage.

Figure 7B:
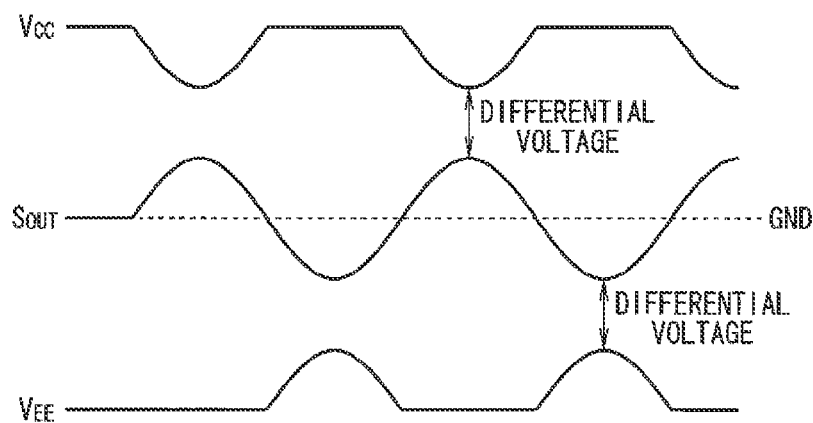

The OR circuit 703 carries out an operation on two comparison results detected by the comparator circuits 702a and 702b, and switches the mode determining signal M from a low level to a high level when either of the differential voltages becomes lower than a preset reference voltage. FIG. 7B illustrates relationships between the negative output power-supply voltage $V_{EE}$, the positive output power-supply voltage $V_{CC}$, and the output signal $S_{OUT}$ from the amplifier circuit 5, in the mode detecting circuit 7. In the example illustrated in FIG. 7B, the negative output power-supply voltage $V_{EE}$, the positive output power-supply voltage $V_{CC}$, and the output signal $S_{OUT}$ are compared with the reference voltage. However, it is possible to directly compare the voltage of the output signal $S_{OUT}$ with the reference voltage.

Figure 8A:
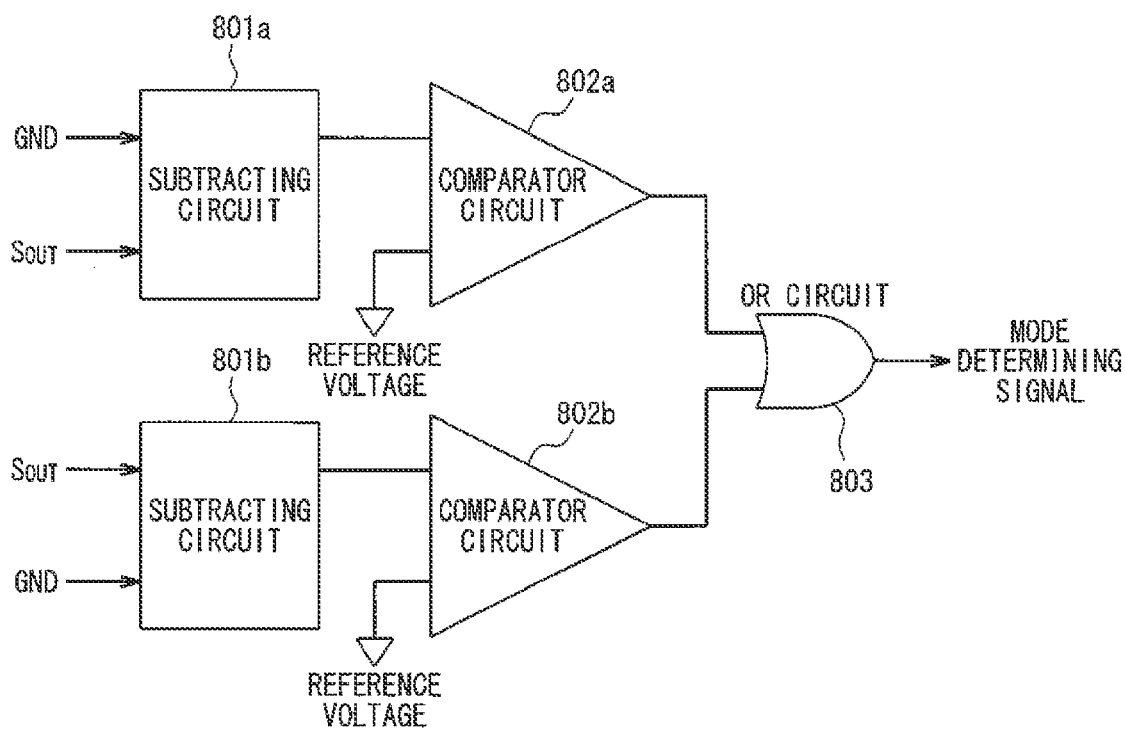
FIGS. 8A and 8B are views illustrative of a configuration example of the mode detecting circuit illustrated in FIG. 1 in more detail, and is a view illustrative of relationships between a reference voltage and the output signal $S_{OUT}$.

FIG. 8A is a view illustrative of a configuration of the mode detecting circuit 7 in the above case in more detail. The mode detecting circuit 7 is provided with: subtracting circuits 801a and 801b; comparator circuits 802a and 802b; and an OR circuit 803. Then, the subtracting circuit 801a detects the differential voltage between the ground voltage GND and the output signal $S_{OUT}$ from the amplifier circuit 5. In addition, the subtracting circuit 801b detects the differential voltage between the output signal $S_{OUT}$ and the ground voltage GND. Furthermore, by use of the comparator circuits 802a and 802b, the respective differential voltages are compared with a preset reference voltage.

Figure 8B:
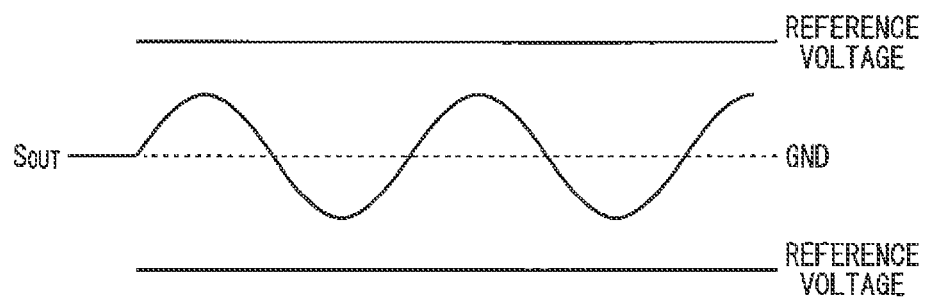

The OR circuit 803 carries out an operation on two comparison results detected by the comparator circuits 802a and 802b, and switches the mode determining signal M from a low level to a high level when either of the differential voltages becomes lower than a preset reference voltage. FIG. 8B illustrates relationships between the ground voltage GND and the output signal $S_{OUT}$ from the amplifier circuit 5, in the mode detecting circuit 7.

In the present embodiment, at least the charge pump circuit 4 out of the charge pump circuit 4 and the amplifier circuit 5, as described above, can be configured as a semiconductor integrated circuit that is integrated on a semiconductor substrate by use of MOS transistors.

(Load Driving System)

Next, operations of the load driving system 1 according to the present embodiment will be described more specifically.

The mode detecting circuit 7 detects the positive output power-supply voltage $V_{CC}$, the negative output power-supply voltage $V_{EE}$, and the output signal $S_{OUT}$, and makes the charge pump circuit 4 operate in mode 1 in a range where the amplitude of the output signal $S_{OUT}$ is small and the charge pump circuit 4 can operate in mode 1 without a problem. On the other hand, the mode detecting circuit 7 makes the charge pump circuit 4 operate in mode 2 in a range where the charge pump circuit 4 has a problem in operating in mode 1, such as in a case where the output signal $S_{OUT}$ is subject to clipping or the like.

Figure 9:
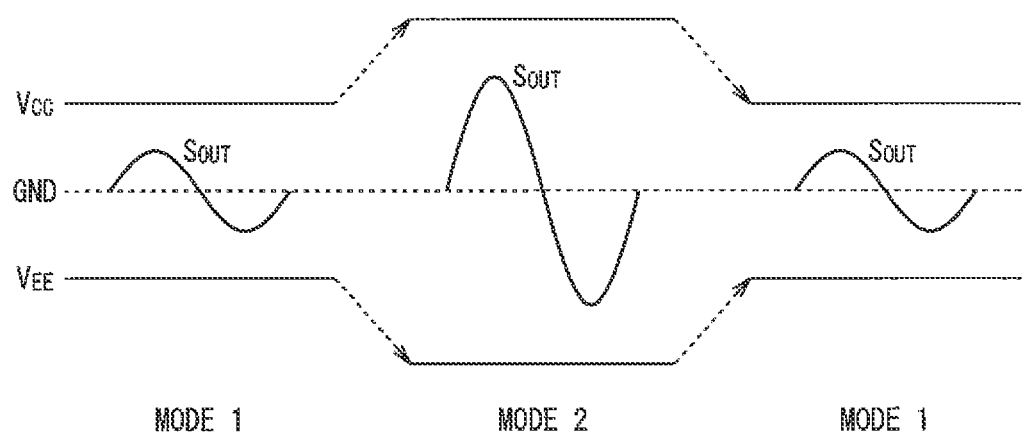
FIG. 9 is a view illustrative of switching a mode detecting signal according to an embodiment of the present invention.

In such operations, the charge pump circuit 4 according to the present embodiment automatically switches between mode 1 and mode 2 in accordance with the state of the output signal $S_{OUT}$. Then, the positive output power-supply voltage $V_{CC}$ and the negative output power-supply voltage $V_{EE}$ generated in the charge pump circuit 4 timely change as illustrated in FIG. 9, so that they can output the output signal $S_{OUT}$ without a problem.

Figure 10:
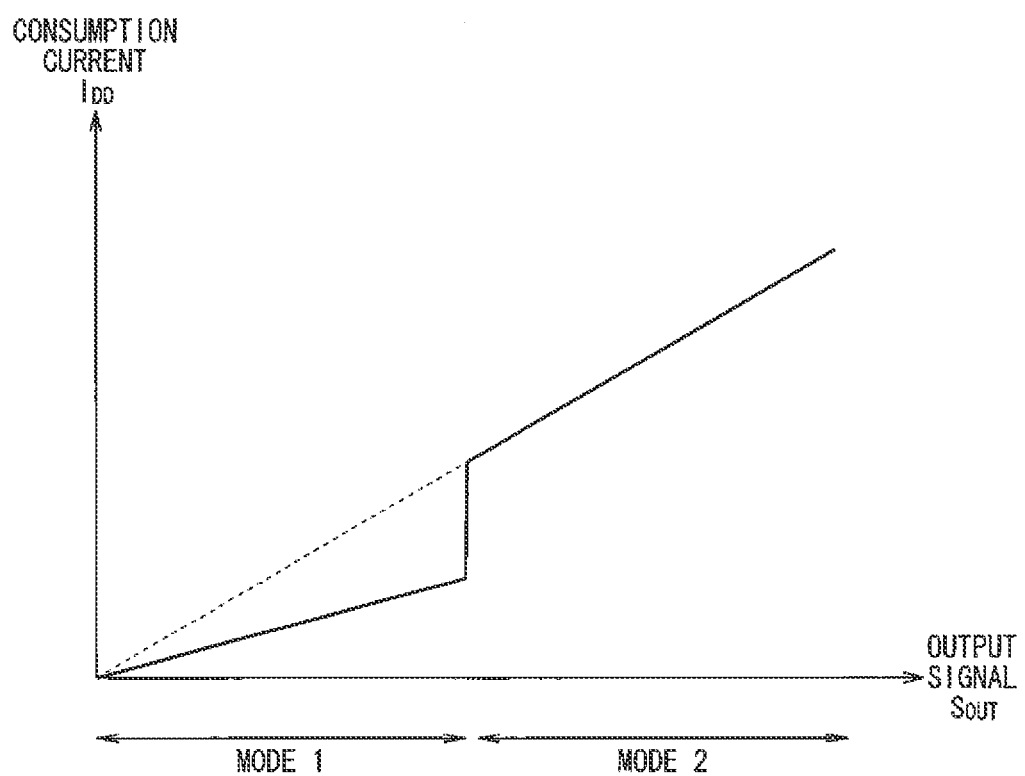
FIG. 10 is a view illustrative of relationships between magnitude of the output signal and current $I_{DD}$ consumed by the load driving system according to an embodiment of the present invention.

FIG. 10 is a view illustrative of relationships between magnitude of the output signal $S_{OUT}$ and current $I_{DD}$ consumed by the load driving system 1. A driven circuit operates in a voltage range of $V_{DD}$ that is the input power-supply voltage in mode 1, whereas it operates in a voltage range of $2 V_{DD}$ in mode 2. Therefore, in mode 1, only a half the current consumed in mode 2 is consumed. This is because the output current of 2I is made available from the input current of I, by converting the input power of $V_{DD} \times I$ in mode 1 into the power of $\frac{1}{2} V_{DD} \times 2I$. That is to say, in mode 1, the power consumption of the load driving system 1 can be cut in half. Accordingly, in the present embodiment, by operating the load driving system 1 in mode 1 as much as possible in the range where the load driving system 1 can operate without a problem, it is possible to reduce the power consumption of the load driving system 1.

In addition, the above embodiment is a proffered embodiment of the present invention. Technically preferable various limitations have been set, but the scope of the present invention is not limited thereto, unless there is a specific description of limiting the present invention. Furthermore, in the drawings described in the above description, for convenience of drawings, reduction scales in horizontal and vertical sizes of members and parts are different from the actual ones.

Moreover, the present invention is not limited to the above-described embodiment, and it is to be understood that variations, modifications, and the like may occur within the scope where an object of the present invention is achievable.

INDUSTRIAL AVAILABILITY

The present invention is adaptable to any type of charge pump circuit and a semiconductor circuit for driving the charge pump circuit, as far as the charge pump circuit supplies the power to a load by driving a driven circuit and has a configuration for which the reduction in power consumption is desired.

REFERENCE SIGNS LIST 201a-201c capacitors
202a-202k switching elements 1 load dicing system
2 clock generating circuit
3 switch controlling circuit
4 charge pump circuit
5 amplifier circuit
6 load
7 mode detecting circuit
701a, 701b, 801a, 801b subtracting circuits
702a, 702b, 802a, 802b comparator circuits
703, 803 OR circuits

The invention claimed is:

1. A charge pump circuit, to be supplied with electric charge from an input power supply, for generating a positive output power-supply voltage of a positive output power supply and a negative output power-supply voltage of a negative output power supply, the charge pump circuit comprising:
 a first capacitor;
 a second capacitor connectable in series with the first capacitor;
 a third capacitor for holding the electric charge corresponding to the negative output power-supply voltage; and
 a switching circuit for electrically connecting or separating the first capacitor, the second capacitor, and the third capacitor,
 wherein the switching circuit repeats:
 a first state in which the charge supplied from the input power supply is accumulated in the first capacitor and the second capacitor connected in series with the first capacitor;
 a second state in which the charge accumulated in the first capacitor in the first state is transferred to the third capacitor and the positive output power-supply voltage is held by the charge accumulated in the second capacitor;
 a third state in which the charge supplied from the input power supply is accumulated in the first capacitor and the second capacitor connected in series with the first capacitor; and
 a fourth state in which the charge accumulated in the second capacitor in the third state is transferred to the third capacitor and the positive output power-supply voltage is held by the charge accumulated in the first capacitor.

2. The charge pump circuit according to claim 1, wherein the switching circuit includes:
 a first switching unit for connecting the input power supply or a ground terminal to an anode terminal of the first capacitor;
 a second switching unit for connecting the positive output power supply or the negative output power supply to a cathode terminal of the first capacitor;
 a third switching unit for connecting the positive input power supply or the ground terminal to an anode terminal of the second capacitor; and
 a fourth switching unit for connecting the ground terminal or the negative output power supply to a cathode terminal of the second capacitor.

3. The charge pump circuit according to claim 2,
 wherein, in the first state, the switching circuit connects the input power supply to the anode terminal of the first capacitor and connects the positive output power supply to the cathode terminal of the first capacitor, the switching circuit connects the positive output power supply to the anode terminal of the second capacitor and connects the ground terminal to the cathode terminal of the second capacitor, and the switching circuit connects the ground terminal to the anode terminal of the third capacitor and connects the negative output power supply to the cathode terminal of the third capacitor,
 wherein, in the second state, the switching circuit connects the ground terminal to the anode terminal of the first capacitor and connects the negative output power supply to the cathode terminal of the first capacitor, the switching circuit connects the positive output power supply to the anode terminal of the second capacitor and connects the ground terminal to the cathode terminal of the second capacitor, and the switching circuit connects the ground terminal to the anode terminal of the third capacitor and connects the negative output power supply to the cathode terminal of the third capacitor,
 wherein, in the third state, the switching circuit connects the input power supply to the anode terminal of the first capacitor and connects the positive output power supply to the cathode terminal of the first capacitor, the switching circuit connects the positive output power supply to the anode terminal of the second capacitor and connects the ground terminal to the cathode terminal of the second capacitor, and the switching circuit connects the ground terminal to the anode terminal of the third capacitor and connects the negative output power supply to the cathode terminal of the third capacitor, and
 wherein, in the fourth state, the switching circuit connects the input power supply to the anode terminal of the first capacitor and connects the positive output power supply to the cathode terminal of the first capacitor, the switching circuit connects the ground terminal to the anode terminal of the second capacitor and connects the negative output power supply to the cathode terminal of the second capacitor, and the switching circuit connects the ground terminal to the anode terminal of the third capacitor and connects the negative output power supply to the cathode terminal of the third capacitor.

4. The charge pump circuit according to claim 1, wherein absolute values of the positive output power-supply voltage and the negative output power-supply voltage are approximately a half a voltage of the input power supply, by accumulating the charge in the first capacitor, the second capacitor, and the third capacitor.

5. The charge pump circuit according to claim 1, wherein the switching circuit further repeats:
 a fifth state in which the charge supplied from the input power supply is accumulated in the first capacitor, the charge accumulated in the second capacitor is transferred to the third capacitor, and the input power supply is connected to the positive output power supply; and
 a sixth state in which the charge supplied from the input power supply is accumulated in the second capacitor, the charge accumulated in the first capacitor is transferred to the third capacitor, and the input power supply is connected to the positive output power supply.

6. The charge pump circuit according to claim 5, wherein the switching circuit further includes:
 a fifth switching unit for connecting a terminal into which the input power supply is input and the positive output power supply;
 a sixth switching unit for connecting the cathode terminal of the first capacitor and the ground terminal; and
 a seventh switching unit for connecting the anode terminal of the second capacitor and the input power supply.

7. The charge pump circuit according to claim 5,
 wherein, in the fifth state, the switching circuit connects the input power supply to the anode terminal of the first capacitor and connects the ground terminal to the cathode terminal of the first capacitor, the switching circuit connects the ground terminal to the anode terminal of the second capacitor and connects the negative output power supply to the cathode terminal of the second capacitor, and the switching circuit connects the ground terminal to the anode terminal of the third capacitor, connects the negative output power supply to the cathode terminal of the third capacitor, and connects the input power supply to the positive output power supply, and wherein, in the sixth state, the switching circuit connects the ground terminal to the anode terminal of the first capacitor and connects the negative output power supply to the cathode terminal of the first capacitor, the switching circuit connects the input power supply to the anode terminal of the second capacitor and connects the ground terminal to the cathode terminal of the second capacitor, and the switching circuit connects the ground terminal to the anode terminal of the third capacitor, connects the negative output power supply to the cathode terminal of the third capacitor, and connects the input power supply to the positive output power supply.

8. The charge pump circuit according to claim 5, wherein absolute values of the positive output power-supply voltage and the negative output power-supply voltage are approximately same with a voltage of the input power supply, by accumulating the charge in the first capacitor, the second capacitor, and the third capacitor.

9. A semiconductor integrated circuit,
wherein the charge pump circuit according to claim 1 is operated to repeat the first state to the fourth state, when a differential voltage between the positive output power-supply voltage and a value of an output signal voltage of an amplifier that operates by the positive output power-supply voltage and the negative output power-supply voltage, and a differential voltage between a value of the output signal voltage and a value of the negative output power-supply voltage are both higher than a preset reference voltage,
wherein the switching circuit of the charge pump circuit further repeats:
a fifth state in which the charge supplied from the input power supply is accumulated in the first capacitor, the charge accumulated in the second capacitor is transferred to the third capacitor, and the input power supply is connected to the positive output power supply; and
a sixth state in which the charge supplied from the input power supply is accumulated in the second capacitor, the charge accumulated in the first capacitor is transferred to the third capacitor, and the input power supply is connected to the positive output power supply to repeat the fifth state and the sixth state, when any one of the differential voltages is lower than a preset reference voltage.

10. A semiconductor integrated circuit, wherein the charge pump circuit according to claim 1 is operated to repeat the first state to the fourth state, when an absolute value of a differential voltage between a value of an output signal voltage from an amplifier that operates by the positive output power-supply voltage and the negative output power-supply voltage and a value of ground voltage is lower than a preset reference voltage,
wherein the switching circuit of the charge pump circuit further repeats:
a fifth state in which the charge supplied from the input power supply is accumulated in the first capacitor, the charge accumulated in the second capacitor is transferred to the third capacitor, and the input power supply is connected to the positive output power supply; and
a sixth state in which the charge supplied from the input power supply is accumulated in the second capacitor, the charge accumulated in the first capacitor is transferred to the third capacitor, and the input power supply is connected to the positive output power supply to repeat the fifth state and the sixth state, when the absolute value of the differential voltage is higher than a preset reference voltage.

11. A control method of a charge pump circuit, to be supplied with electric charge from an input power supply, for generating a positive output power-supply voltage of a positive output power supply and a negative output power-supply voltage of a negative output power supply, the charge pump circuit comprising:
a first capacitor;
a second capacitor connected in series with the first capacitor; and
a third capacitor for holding the electric charge corresponding to the negative output power-supply voltage,
wherein the control method repeats:
a first state in which the charge supplied from the input power supply is accumulated in the first capacitor and the second capacitor connected in series with the first capacitor;
a second state in which the charge accumulated in the first capacitor in the first state is transferred to the third capacitor and the positive output power-supply voltage is held by the charge accumulated in the second capacitor;
a third state in which the charge supplied from the input power supply is accumulated in the first capacitor and the second capacitor connected in series with the first capacitor; and
a fourth state in which the charge accumulated in the second capacitor in the third state is transferred to the third capacitor and the positive output power-supply voltage is held by the charge accumulated in the first capacitor.

12. The control method of the charge pump circuit according to claim 11, the method repeats:
a fifth state in which the charge supplied from the input power supply is accumulated in the first capacitor, the charge accumulated in the second capacitor is transferred to the third capacitor, and the input power supply is connected to the positive output power supply; and
a sixth state in which the charge supplied from the input power supply is accumulated in the second capacitor, the charge accumulated in the first capacitor is transferred to the third capacitor, and the input power supply is connected to the positive output power supply.

* * * * *